United States Patent [19]

Schmidt

[11] Patent Number: 5,440,228

[45] Date of Patent: Aug. 8, 1995

[54] SIMULTANEOUS SIGNALS IFM RECEIVER USING PLURAL DELAY LINE CORRELATORS

[76] Inventor: Ralph O. Schmidt, 19964 Mallory Ct., Saratoga, Calif. 95070-4437

[21] Appl. No.: 208,538

[22] Filed: Mar. 9, 1994

[51] Int. Cl.$^6$ ............................................. G01R 23/00
[52] U.S. Cl. .............................. 324/76.12; 324/76.35; 324/76.47; 324/76.54; 324/76.55; 342/13
[58] Field of Search ............... 324/76.12, 76.19, 76.24, 324/76.35, 76.47, 76.54, 76.55, 76.68; 342/13, 14, 20; 375/94, 102

[56] References Cited

U.S. PATENT DOCUMENTS

| | | | |
|---|---|---|---|
| 2,434,914 | 1/1948 | Earp | 324/76.52 |
| 3,189,820 | 6/1965 | Lowman | 324/76.54 |
| 3,617,900 | 11/1971 | Fink et al. | 324/76.54 |
| 3,939,411 | 2/1976 | James | 324/76.35 |
| 4,188,628 | 2/1980 | Langeraar et al. | 342/192 |
| 4,194,206 | 3/1980 | Tsui | 342/13 |
| 4,336,541 | 6/1982 | Tsui | 342/13 |
| 4,414,505 | 11/1983 | Cuckson | 324/85 |
| 4,426,648 | 1/1984 | Tsui | 342/20 |
| 4,504,785 | 3/1985 | Tucker | 324/76.24 |
| 4,547,727 | 10/1985 | Tsui | 324/76.47 |
| 4,633,516 | 12/1986 | Tsui | 455/226.1 |
| 4,859,934 | 8/1989 | Gale et al. | 324/76.56 |
| 4,963,816 | 10/1990 | Tsui | 324/77 H |
| 5,109,188 | 4/1992 | Sanderson | 324/77 H |

OTHER PUBLICATIONS

V. F. Pisarenko, "The Retrieval of Harmonics from a Covariance Function," Geophys. J. Royal Astron. Soc., No. 33, 1973, pp. 347–366. (Month unavailable).
R. O. Schmidt, "Multiple Emitter Location and Signal Parameter Estimation," IEEE Trans. Antenn. Propag., vol. AP-34, No. 3, pp. 276–280, Mar. 1986.

*Primary Examiner*—Kenneth A. Wieder
*Assistant Examiner*—Christopher M. Tobin
*Attorney, Agent, or Firm*—Robert Samuel Smith

[57] ABSTRACT

A simultaneous signals frequency measurement receiver comprising a number n of delay line correlators, with a complete set of n, delays, a number 2n of digitizers, computational means to define an m×m matrix R, to calculate the mathematically defined eigenvectors of R, to calculate the simultaneously received signal frequencies. This receiver measures the frequencies of simultaneous signals based on a digitized sample of all the correlation outputs of a complete set of delay line correlators.

7 Claims, 3 Drawing Sheets

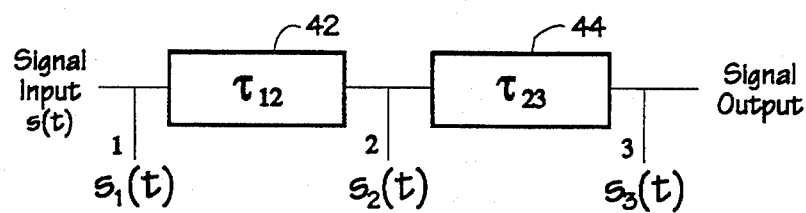
Fig. 4 Serial (tapped) Delay Line Model (for m=3)
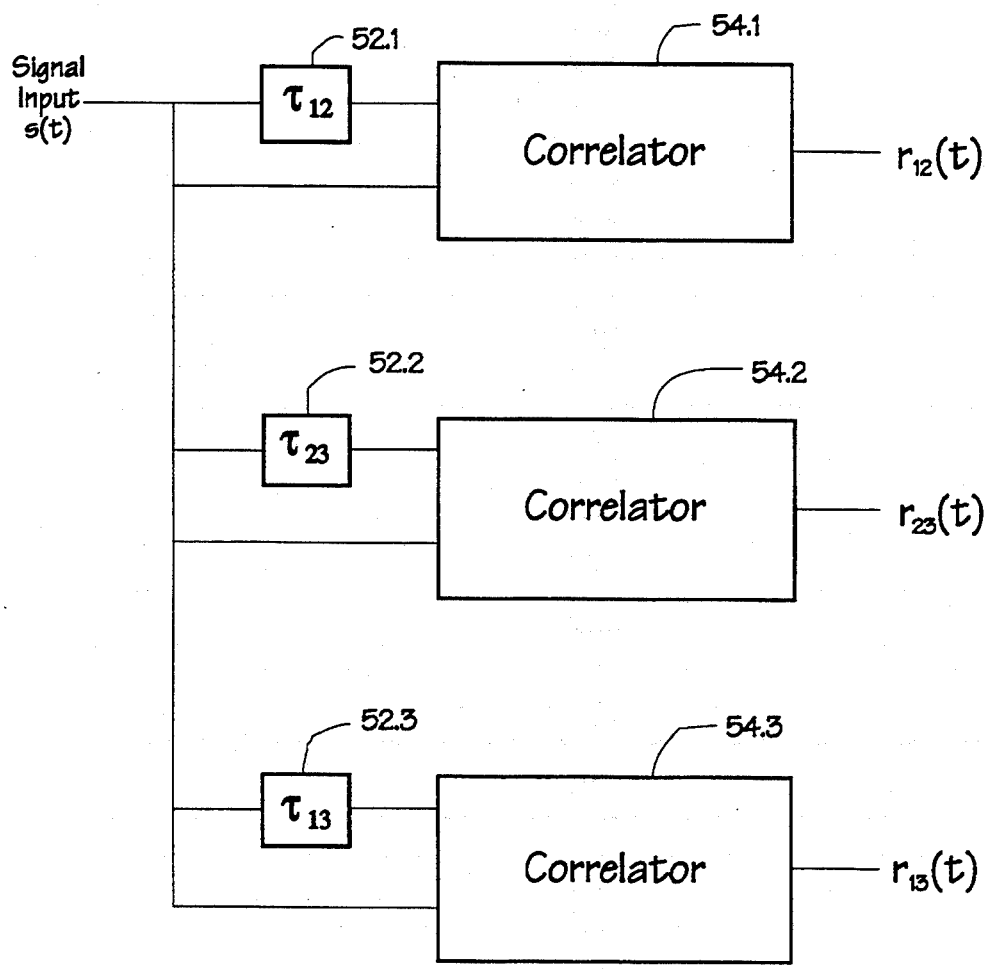
Fig. 5 Parallel Delays: A Complete Set (for m=3)

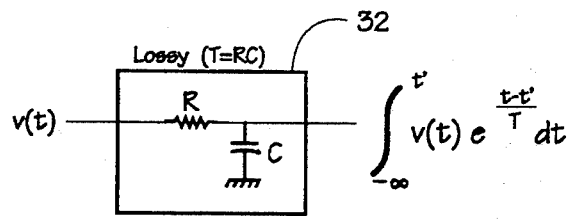
Fig. 3A
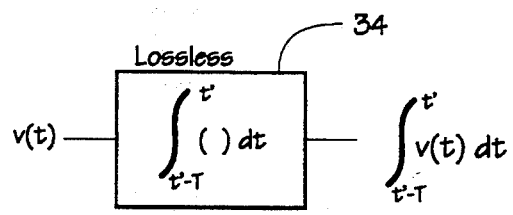
Fig. 3B
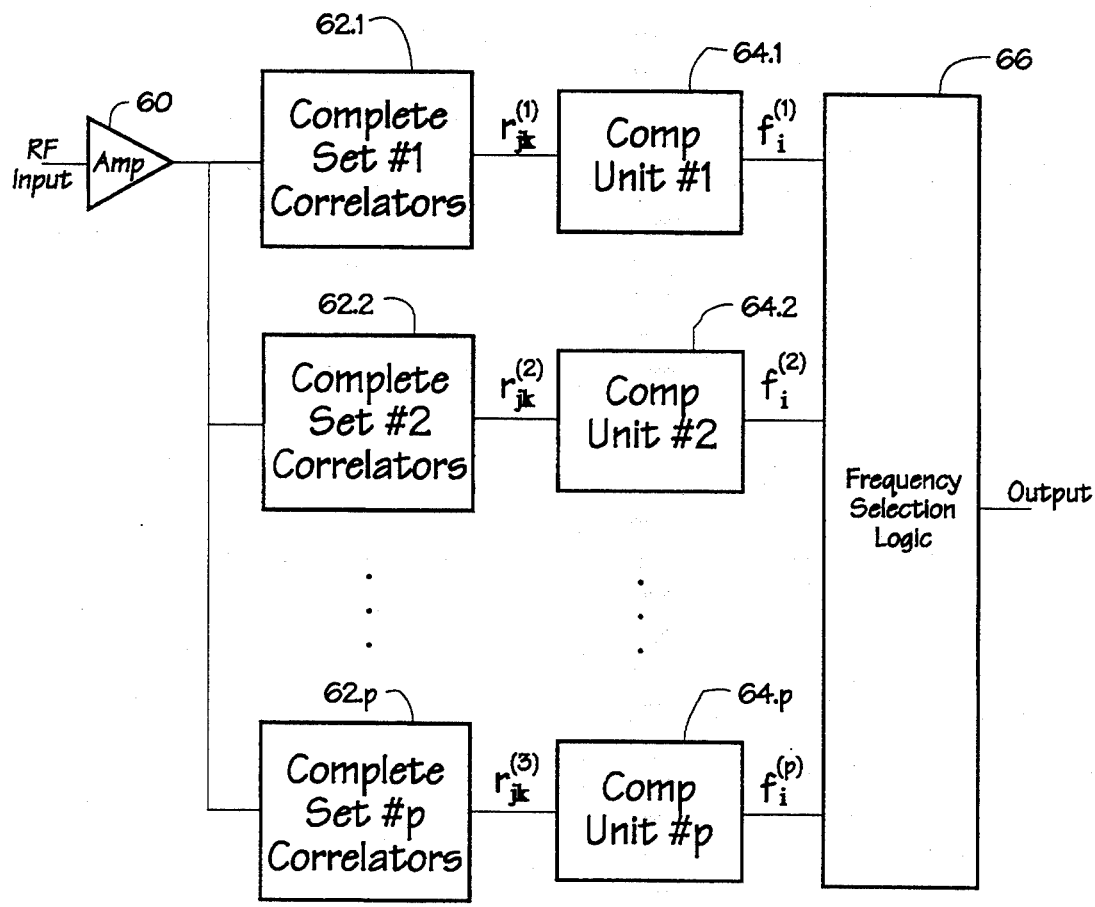
Fig. 6 System of Complete Sets of Correlators

SIMULTANEOUS SIGNALS IFM RECEIVER USING PLURAL DELAY LINE CORRELATORS

BACKGROUND

1. FIELD OF THE INVENTION:

This invention relates to signal frequency measurement devices and more particularly to Instantaneous Frequency Measurement (IFM) receivers intended for measuring and reporting frequencies of radar and other signals.

2. DESCRIPTION OF THE PRIOR ART:

The instantaneous frequency measurement (IFM) receiver using delay line phase discriminators was developed in the '50s and '60s as a wide bandwidth and high frequency resolution analyzer of pulsed radar signals. Accurate real-time indication of the frequency of pulsed or continuous wave (CW) radar signals is an essential link in electronic warfare (EW) systems. Equipment using the well-known IFM technique can provide frequency information in such a short time that highly effective jamming signals may be produced and transmitted in response to individual pulses received. The IFM receiver, because of its desirable characteristics, has become a major EW building block over the past 30 years. In the last 20 years, novel means of digitizing the angle output of the phase discriminators have given us the digital IFM (DIFM) which is now dominant commercially.

In a typical system, the received radar signal is sent through a delay line of delay $\tau$. This causes the signal to undergo a phase shift $\phi$ which is directly related to the frequency f of the signal according to $\phi = 2\pi f \tau$. If the phase shift is measured, the frequency of the signal can be measured and reported. The IFM receiver is able to measure the frequency of a single pulse of signal as short as 100 nanoseconds or less. Thus, the frequency measurement is referred to as "instantaneous."

However, in all such IFMs and DIFMs, multiple signals received simultaneously present serious problems. Simultaneous signals are received due to random pulse coincidence, simultaneous multi-frequency pulsed radars, CW or high duty-cycle radars, multipath, or spurious receiver-generated components. Although several patented solutions to special cases of this problem have appeared throughout the '80s, the general problem is widely considered unsolved.

The earliest pertinent prior art is described in U.S. Pat. No. 2,434,914, granted to C. W. Earp in 1948 for Frequency Indicating Cathode-Ray Oscilloscope. This patent established the fundamental idea behind the Instantaneous Frequency Measurement or IFM receiver. The description is of an apparatus which subjects a sinusoidal signal of unknown frequency to a known delay so that the signal and its delayed version may be applied to the x and y axes, respectively, to deflect the trace of a cathode ray tube (CRT) oscilloscope. It is shown there that, while the signal is 'ON,' the oscilloscope trace is deflected from the center of the oscilloscope face to a position with radius proportional to signal strength and angle proportional to frequency. That is, it measures virtually instantaneously the frequency of the incoming signal; hence its description as an IFM receiver. Frequency is measured by visually interpreting the angle of the deflected oscilloscope trace.

If two or more signals appear simultaneously on the input, the trace cycles between the 'two correct positions' at the difference frequency, tracing out a complicated path which depends on the signal frequencies and amplitudes. The occurrence of two or more signals simultaneously causes a sporadic dance of the signal, displayed as a spot, all around the screen, and an inability of the computer to make any consistent interpretation of the data. A means for extracting the two frequencies from such observations has not been available.

The first example of a multichannel, digital output IFM appeared in U.S. Pat. No. 3,189,820, granted to R. V. Lowman in 1965 for Plural Channel Signal Receiver including Signal Delay Means. It was thus possible to digitize the angle of the position of the spot on the scope face to provide the correct half-bandwidth of the signal frequency; 1 bit. Several such channels with different delays could be used to provide additional bits of the signal frequency.

Another example of such a multichannel digital IFM appeared in the U.S. Pat. No. 3,617,900 granted to C. Fink, F. E. Burnham and M. I. Marks in 1971 for a Digital Frequency Detecting System. Thus, it became possible to measure the frequency digitally to the correct 90° quadrant (2 bits); even correct sectors of 5.625° (6 bits) had become practical. Several such channels utilizing different delays can then be incorporated with angle detection in each channel for high resolution frequency of a single signal. However, the method is intended to measure only a single frequency.

Still another example of a multichannel digital IFM or digital frequency discriminator (DFD) appeared in the U.S. Pat. No. 4,188,628 for Frequency Measuring Circuit in a Passive Radar Receiver granted to H. B. Langeraar and G. V. Van Rooijen in 1980. Multiple delay line discriminators, which are tuned to different frequency bands, perhaps overlapping, are used with digital detection and recombination filters to select 'preferred' discriminator outputs. However, the method is intended to measure only a single frequency.

It is also possible to utilize a chain of frequency dividers and a delay line frequency discriminator as described in U.S. Pat. No. 4,859,934 granted to P. M. Gale, M. McMillan and A. Gagnon in 1989 for Apparatus for Measuring the Frequency of Microwave Signals. The method is intended to measure only a single frequency.

A particular simultaneous signals problem arises in the case of a radar which transmits two frequencies simultaneously. An attempt to address this problem appeared in U.S. Pat. No. 3,939,411 granted to W. G. James in 1976 for Instantaneous Frequency Measurement System. The idea is that a dispersive delay line will transform simultaneous pulses into time sequential pulses for input to an IFM receiver. This method fails in the case of two pulses which happen to transform into time coincident pulses by the dispersive delay line. Also, it is not intended for the pulse-on-CW case.

A means to measure frequencies of continuous-wave (CW) signals and pulses appeared in U.S. Pat. No. 4,194,206 granted to J. B-Y. Tsui and G. H. Schrick in 1980 for Instantaneous Frequency Measurement (IFM) Receiver with Capability to Separate CW and Pulsed Signals. This works for pulse-on-CW but is not intended for pulse-on-pulse.

An apparatus to detect the presence of two or more signals during the critical frequency encode time in the IFM receiver as a DATA-NOT-VALID flag appeared in U.S. Pat. No. 4,336,541 granted to J. B-Y. Tsui, R. L.

Shaw and J. Caschera in 1982 for Simultaneous Signal Detector for an Instantaneous Frequency Measurement Receiver. The circuit described therein will detect and indicate simultaneous signals when the leading edges of the two pulses are separated by more than 20 nanoseconds. But when the two leading edges are closer, the detection circuit may fail to report simultaneous signals. The circuit treats overlapping but not simultaneous pulses.

An apparatus to detect the presence of two or more simultaneous pulses appeared in U.S. Pat. No.4,426,648 granted to J. B-Y. Tsui and R. L. Shaw in 1984 for Simultaneous Signal Detection for IFM Receivers by Detecting Intermodulation Products. An apparatus to detect the presence of two or more simultaneous signal pulses appeared in U.S. Pat. No. 4,547,727 granted to J. B-Y. Tsui and R. L. Shaw in 1985 for Simultaneous Signal Detection for IFM Receivers by Transient Detection. These provide a simultaneous signal warning flag-they do not measure frequency.

Another simple IFM implementation utilizing only two delay line discriminators and a method for calculating frequency based on the "Chinese Remainder Theorem" appeared in U.S. Pat. No. 4,963,816 granted to J. B-Y. Tsui and W. S. McCormick in 1990 for Instantaneous Frequency Measurement (IFM) Receiver with Only Two Delay Lines. It does not apply to multiple simultaneous input signals.

A Sampling Spectrum Analyzer appeared in U.S. Pat. No. 4,504,785 granted to T. W. Tucker and L. J. Conway in 1985 which utilizes tapped delay lines and a distributed sampling concept to compute a Discrete Fourier Transform (DFT) of a uniform set of samples of an RF input. Although the Sampling Spectrum Analyzer may receive simultaneous signals and measure multiple frequencies in principle, the implementation difficulties are great, and achievable performance (bandwidth and measurement accuracy) for a given number of delays is very limited, compared to the present invention.

Perhaps the simplest IFM circuit, utilizing a single 90° hybrid, appeared in U.S. Pat. No. 4,414,505 granted to H. C. Cuckson and P. D. Curtis in 1983 for Microwave Instantaneous Frequency Measurement Apparatus. The method is intended to measure only a single input frequency.

An IFM Receiver with Digital Processing appeared in U.S. Pat. No. 4,633,516 granted to J. B. Tsui in 1986 which replaces the IFM delay line correlator with a 90° hybrid, A/D circuits and digital processing. Samples arc to be taken at two times differing by $\tau$. The processing permits measurement of a single frequency.

An IFM Receiver with Bandwidth Improvement through Phase Shifted Sampling of Real Signals appeared in U.S. Pat. No. 5,109,188 granted to R. B. Sanderson and J. B-Y. Tsui in 1992 which measures the phase of a signal corresponding to a known delay $\tau$ but in a completely digital system requiring high sample rate A/D converters and other limitations compared to the present invention.

While the IFM receiver has many advantages, a conventional system of the prior art is not intended to measure simultaneously received frequencies. Commercially available IFM receiver systems of the prior art are able to measure the frequency of at most one (the sufficiently stronger) of simultaneously received signals except for certain restricted special cases. It is fairly common for modern radars to transmit pulsed signals consisting of two or more frequencies simultaneously. Furthermore, simultaneous reception of the signals of several radars as coincidental 'pulse on pulse' and 'pulse on CW' are commonly encountered. Responding to such a signals, the conventional IFM receiver of the prior art would, at best, be able to measure one (the strongest) of the signal frequencies received.

An analytic approach to computing the frequencies of multiple sinusoids comprising a (strictly) uniformly sampled time series obtained, in effect, using an ideal (nondispersive/lossless) tapped delay line,is given in

[1] V. F. Pisarenko, "The Retrieval of Harmonies from a Covariance Function," Geophy. J. Royal Astron. Soc., no. 33, 1973, pp. 347-3663.

A method of computing the directions of arrival of multiple signals using arbitrarily placed antennas with arbitrary directional responses and which also applies to measuring frequencies of multiple sinusoids comprising a sampled data time series, is well known as the MUltiple SIgnal Classification (MUSIC) algorithm. It has been successfully implemented for direction finding at frequencies up to 2 GHz but which, when used to measure frequency, is directly suited to tapped delay line implementations. MUSIC is described in

[2] R. O. Schmidt, "Multiple Emitter Location and Signal Parameter Estimation," Proc. RADC Spectral Estimation Workshop, Rome Air Development Center, Griffiss AFB, Rome, N.Y. pp. 243-258, 1979. Reprinted in IEEE Trans Antenn Propag, vol. AP-34, no. 3, pp. 276-280, March 1986, and also in *Modern Spectrum Analysis II*, S. Kesler, Ed., IEEE Press, New York, pp. 141-156, 1986.

The MUSIC algorithm applies to digitized data simultaneously sampled at m taps of a tapped delay line through which the signal is passing. The taps need not be uniformly spaced. The algorithm makes use of all $m(m-1)/2$ correlations $r_{ij}$ between the video signals at the ith and jth taps and the (auto)correlations $r_{ii}$ for a total of $m(m+1)/2$ correlations. The MUSIC technique has been widely known since 1979 and has not been applied successfully to the simultaneous signals IFM problem addressed by the present invention.

There are no commercially available IFM receivers capable of measuring and reporting multiple frequencies of simultaneously received signals.

THE INVENTION

NOTATION & DEFINITIONS

A delay line correlator (FIG. 1) ideally integrates, for T nanoseconds, the product of an input signal s(t) and its delayed and conjugated version $s^*(t-\tau)$; that is, $$r_\tau(t') = \int_{t'-T}^{t'} s(t)s^*(t-\tau)dt.$$

The integration need not be "lossless over T nsec" as just defined (see FIG. 3A), it may be an exponentially weighted sum; that is, "lossy" integration with a decaying memory of the past, wherein $$r_\tau(t') = \int_{-\infty}^{t'} s(t)s^*(t-\tau)\exp\left(\frac{t-t'}{T}\right)dt$$

with integration as in FIG. 3B, which may be sampled at any time t. In practice, the above integrations of complex signals are implemented as two separate integrations to produce an in-phase I and a quadrature Q output. The I and Q video voltages of the discriminator (FIG. 1) are to be interpreted as 'real' and 'imaginary' parts of a complex video voltage for the purposes of the mathematical computations to follow. A delay line discriminator with separate integrators on the real and imaginary video voltage outputs is a correlator; the integrated complex output from the discriminator with delay $\tau$ is the correlation $r_\tau$.

Since the integration is so easily implemented as a resistor-capacitor lowpass filter (see FIG. 3A), with RC=T nsec, without requirements for starting and resetting the integration, this is the preferred embodiment of the integration to be used. In the present description, reference made to T nsec integration is intended to refer to either implementation.

Consider a tapped delay line (FIG. 4) as the model for selecting complete sets of delay lines. The complete set of delay lines may be represented in serial form (FIG. 4) or in parallel form (FIG. 5). In serial form, the taps 1 thru m, in order as the signal travels past, are as shown. The delay from the ith tap to the jth is $\tau_{ij}$; the delay from the jth to the ith is then $\tau_{ji}=-\tau_{ij}$. Consequently, $\tau_{ii}=0$. Clearly, the delay $\tau_{13}$ from taps 1 to 3 must be equal to $\tau_{12}=\tau_{23}$; it must also equal $\tau_{14}=\tau_{45}=\tau_{53}$, as another of many choices. This Delay Sum Rule becomes apparent when the numeric delays are given in the form of a delay matrix T $$T = \begin{bmatrix} \tau_{11} & \tau_{12} & \tau_{13} & \cdots & \tau_{1m} \\ \tau_{21} & \tau_{22} & \tau_{23} & \cdots & \tau_{2m} \\ \tau_{31} & \tau_{32} & \tau_{33} & & \\ \vdots & & & & \vdots \\ \tau_{m1} & \tau_{m2} & & & \tau_{mm} \end{bmatrix} = $$

$$\begin{bmatrix} 0 & \tau_{12} & \tau_{13} & \cdots & \tau_{1m} \\ -\tau_{12} & 0 & \tau_{23} & \cdots & \tau_{2m} \\ -\tau_{13} & -\tau_{23} & 0 & & \\ \vdots & & & & \\ -\tau_{1m} & -\tau_{2m} & & & 0 \end{bmatrix}$$

The Delay Sum Rule requires that $\tau_{ij}=\tau_{ik}+\tau_{kj}$ for all $1 \leq i, j, k, \leq m$. For any set of delays $\tau_{ij}$ which satisfy the delay sum rule, the corresponding matrix T is necessarily anti-symmetric; zeros on the main diagonal and negative element pairs across it.

The Delay Sum Rule is a special case of a more general Serial/Parallel Rule of combining circuits. The rule for cascading general circuit response functions, of which delay lines are special cases, is convolution; that is, $h_{ij}(t)=h_{ik}(t) \ h_{kj}(t)$. Thus, if a general set of circuits satisfies this more general rule, then they are said to be a complete set and may be used in the present invention without modification. Note that the impulse response of a lossy, but nondispersive delay line is $h_{ij}(t)=\alpha\delta(t=\tau_{ij})$ with attenuation $\alpha$ dependent on $\tau_{ij}$ and on frequency. In this case, the Serial/Parallel Rule becomes the Delay Sum Rule $\tau_{ij}=\tau_{ik}+\tau_{kj}$ and, in addition, $\alpha_{ij}=\alpha_{ik}\cdot\alpha_{kj}$. FIG. 4 and FIG. 5 portray the case where $h_{ij}$ is well represented by $\alpha_{ij}\delta(t-\tau_{ij})$.

Note that, if the taps are uniformly spaced, only (m−1) correlators are needed with delays $\tau, 2\tau, 3\tau, \ldots, (m-1)\tau$. In that case, and for the present invention, T is said to be Toeplitz since, along each diagonal of T, the values repeat. Fewer correlators are indeed desireable, but in addition, the Toeplitz structure permits a special computational algorithm in which roots of a single mth order polynomial replaces the calibration method which requires perhaps thousands of m-vector dot products.

There is little reason to display the lower triangular part; even the diagonal zeros might have been discarded in the following examples of 4×4 delay matrices which do satisfy the delay sum rule:

$$\begin{bmatrix} 0 & 1 & 2 & 3 \\ & 0 & 1 & 2 \\ & & 0 & 1 \\ & & & 0 \end{bmatrix}, \begin{bmatrix} 0 & 1 & 2 & 4 \\ & 0 & 1 & 3 \\ & & 0 & 2 \\ & & & 0 \end{bmatrix}, \begin{bmatrix} 0 & 1 & 8 & 63 \\ & 0 & 7 & 62 \\ & & 0 & 55 \\ & & & 0 \end{bmatrix},$$

$$\begin{bmatrix} 0 & 55 & 62 & 63 \\ & 0 & 7 & 8 \\ & & 0 & 1 \\ & & & 0 \end{bmatrix}, \begin{bmatrix} 0 & 1 & 56 & 63 \\ & 0 & 55 & 62 \\ & & 0 & 7 \\ & & & 0 \end{bmatrix}.$$

Correlations $r_\tau$ for various $\tau$ may next be assembled into an m×m correlation matrix R which is defined such that $R_{ij}$ equals the output of a $\tau_{ij}$-correlator. The correlation matrix R is defined to be:

$$R = \begin{bmatrix} r_{11} & r_{12} & r_{13} & \cdots & r_{1m} \\ r_{21} & r_{22} & r_{23} & \cdots & r_{2m} \\ r_{31} & r_{32} & r_{33} & & \\ \vdots & & & & \vdots \\ r_{m1} & r_{m2} & & & r_{mm} \end{bmatrix} = $$

$$\begin{bmatrix} 0 & r_{12} & r_{13} & \cdots & r_{1m} \\ r_{12}^* & 0 & r_{23} & \cdots & r_{2m} \\ r_{13}^* & r_{23}^* & 0 & & \\ \vdots & & & & \\ r_{1m}^* & r_{2m}^* & & & 0 \end{bmatrix}$$

where it is noted, for the purpose of the present invention, that zeros may be introduced along the main diagonal without effect on the frequency measurements. This removes the need for any zero delay correlators.

A complete set of delays is defined to be a set which satisfies the Delay Sum Rule. Note that, with the Delay Sum Rule, a complete set of delays is defined by the top row of T; since the other delays are uniquely determined and can be obtained from the top row. An IFM design is defined by simply specifying $[\tau_{12}, \tau_{13}, \ldots, \tau_{1m}]$. The delays needed to implement it are, of course, all of the distinct delays of T; which may number as few as $(m-1)$ or as many as $m(m-1)/2$, depending on repetitions. Note that not all sets of $m(m-1)/2$ delays can be represented in the form of a tapped delay line; most arbitrary sets are not complete sets.

A complete set of correlators is a set of n delay line correlators, one for each distinct delay of a complete set; there is no need for two correlators with the same length delay line. To specify a complete set of correlators for use in the present invention, the top row of T is all that needs to be specified: $[\tau_{12}, \tau_{13}, \ldots, \tau_{1m}]$. The elements of the second row can be obtained from the first by subtracting $\tau_{12}$ from the top row; the third row obtained from the second by subtracting $\tau_{23}$; and so on.

In its most general form, the present invention is implemented with one or more complete sets of delay line correlators. Where, in the IFM prior art, one delay line correlator could measure one frequency, the present invention provides one complete set of correlators to measure multiple frequencies. It will be seen that FIG. 2 is a complete set and that the computation based on measurements made within the complete set will produce multiple frequency estimates. In the prior IFM art, the frequencies measured with more than one delay line correlator are combined to resolve ambiguous indications of frequency. In the present invention, the frequencies measured with more than one complete set of delay line correlators may also be combined to resolve ambiguities. The computation which produces a final set of frequency estimates from several complete correlator sets will also be shown.

In summary, the Delay Sum Rule defines the range of application of the present invention; the frequencies of the input signals can be measured with the method of the present invention given any complete set of delay line correlators; utilizing a complete set of delays. The measurements of one or more blocks of complete sets of correlators can be combined to finally produce frequency measurements of multiple signals. The present invention does not require a zero-delay correlator.

The Delay Sum Rule is required of all sets of delays being considered for use with the present invention. The general algorithm for measuring frequencies begins with the R matrix. It applies for any complete set of correlators. The following definitions are also pertinent to the description to follow.

$R = m \times m$ 'correlation' matrix, $\lambda_i(R) = $ ith eigenvalue of $R$; $\lambda_1 \geq \lambda_2 \geq \ldots \geq \lambda_i \geq \ldots \geq \lambda_m$ $e_i(R) = $ eigenvector corresponding to eigenvalue $\lambda_i$, $e_{max} = $ eigenvector corresponding to the maximum eigenvalue $\lambda_1$, $e_{min} = $ eigenvector corresponding to the minimum eigenvalue $\lambda_m$, Inasmuch as the present invention is particularly advantageous in monitoring and measuring signals at microwave frequencies, the embodiments of the invention described hereafter, illustrate that field of application.

SUMMARY OF INVENTION

This invention is directed toward an IFM receiver having the capability to detect and measure the frequency of each signal of a group of two or more signals arriving simultaneously at the receiver. Basically, the apparatus includes a plurality of delay line correlators connected to integrators. The delay line correlators have inputs connected in parallel to an RF composite signal source, wherein each correlator outputs a video signal that is separated into and represented by an In—phase component signal and quadrature phase component signal. Each component is digitized (separate from the other component) so that the digitized signals may be presented to means for computing frequencies independently.

The single frequency measurement principle of an IFM receiver is well known. In the present invention, the frequency measurement principle is expanded to provide a capability for measurement of the frequencies of simultaneously received signals.

A conventional IFM receiver of the prior art is unique for its wide bandwidth and high frequency measurement accuracy which it achieves by employing several delay line correlators with a large range of delays. The overall unambiguous IFM bandwidth is determined by the shortest delay. The frequency measurement accuracy is largely determined by the longest delay. The accuracy over the wide bandwidth is achieved by using the wideband, inaccurate frequency measurement to resolve the ambiguity in the more accurate frequency measurements. But because the correlators are used singly, the method of the prior art is limited to a single signal frequency. The present invention measures the frequencies of simultaneous signals based on a digitized sample of all the correlation outputs of a complete set of delay line correlators.

The IFM receiver of the present invention also achieves wide bandwidth and high frequency measurement accuracy but is expanded to permit measurement of frequencies of simultaneous signals. Instead of several delay line correlators each used to measure frequency separately, complete sets of delay line correlators are used in combination, to measure multiple frequencies. The overall unambiguous IFM bandwidth B is determined by the set with the shortest delay. The accuracy is determined by the set with the longest delay. It is as before but includes simultaneous signals capability.

The present invention makes use of and depends upon a combination of:

1. The time delay discriminator of the IFM prior art but with T nanosecond (lossless or lossy) integration to comprise a time delay correlator.
2. Direct (amplitude) digitization of said correlator outputs to replace the angle (frequency) digitization of the IFM prior art.
3. A modified correlation matrix R—zeros along the main diagonal and time-shifted definitions of correlations in the off-diagonal elements—specifically for use with parallel delay lines instead of the serial (tapped) delay lines of the MUSIC method [1]. A greater number of physical delay lines are generally necessary; the additional delays are always determined by the given delays of the serial (tapped) delay line model.
4. An operational algorithm for computing the frequencies of multiple signals which requires only the minimum eigenvector of said matrix R. Implied and included is a calibration algorithm for "calibrating" the delay line correlators, by calculating and storing the maximum eigenvector of said matrix R. R is measured while the correlators are responding to a single frequency calibration signal from an RF test generator or its equivalent. The calibration eigenvectors corresponding to selected calibration frequencies over the IFM bandwidth are stored for use thereafter in the operational algorithm.

5. If T is Toeplitz, an alternative operational algorithm becomes available; calibration is unnecessary, the minimum eigenvector of B is interpreted as a vector with components which are the coefficients of a polynomial whose roots are to be computed, revealing the frequencies in their arguments. In the MUSIC method, R is, at best, approximately Toeplitz if there is any noise, received or otherwise, in the system.

6. A complete set of delay line correlators has an unambiguous frequency range (bandwidth) and a frequency measurement accuracy. The frequencies measured by the wider bandwidth complete sets may be used to resolve the ambiguities of the narrower so that the accuracy of the narrower may be realized. This is precisely what is traditionally done in the 1 signal case in the prior art IFM.

Frequency is measured in a conventional IFM as a sequence of resolution-improving steps; each step uses a delay discriminator to measure a single signal frequency, thus limiting the entire process to a single frequency. The present invention teaches how a step may be implemented using not one but a set of delay line correlators to provide multiple frequency estimates in any one step. The present invention teaches the method and means to estimate multiple frequencies in one step, given a complete set of correlators. The present invention also teaches that several distinct sets of delay line correlators may be implemented and used in a sequence of resolution-improving steps.

Design examples as taught by the present invention follow. The present invention teaches that wide bandwidth, high-accuracy, multiple frequency measurements can be implemented in one step. However, the present invention also teaches that several correlators may be treated as a unit capable of measuring more than one frequency and that several such units with different bandwidths and resolutions may be cascaded by design.

1. [1 63] is a 2 Signal IFM design using a complete set of 3 delay line correlators with delays $\tau = 1,62,63 \times \tau_0$. It provides the same effective frequency resolution as a 64 point Discrete Fourier Transform (DFT). A practical number of frequency cells is 4096, since one IFM correlator can provide as much as 6 bits beyond the 6 bits provided by the DFT resolution. Two frequencies differing by 16 cells or more (a quarter of the DFT resolution) will each be measured with little or no cross effects.

2. [1 8 63] is a 3 Signal IFM design using 1 complete set of 6 delays $\tau = 1,7,8,55, 62,63 \times \tau_0$. Again, it provides the same effective frequency resolution as a 64 point DFT. A practical number of frequency cells is 4096. Two frequencies differing by 16 cells or more will each be measured with little or no cross effects and there is a capability for measuring 3 simultaneous frequencies.

3. [1][4][16][64] is a 1 signal IFM design using 4 sets (indeed, a well-known traditional design). Each complete set is equivalent to a single delay line correlator. A practical number of frequency cells is 4096. Two frequencies, simultaneously received, cannot be measured with this design.

4. [1 2][2 4][4 8][16][16 32][32 64] is a 2 signal IFM design using 6 complete sets for a total of 7 delays $\tau = 1,2,4,8,16,32,64 \times \tau_0$. Each complete set utilizes 3 delay line correlators. The design will be close in performance to the traditional 1 signal, 7 cascade IFM design—[1][2][4][8][16][32][64]—but with 2 frequency measurement capability. A practical number of frequency cells is 4096. Two frequencies differing by 16 cells or more will each be measured with little or no cross effects.

5. [1 32][2 64] is a 2 signal IFM design using 2 complete sets for a total of 6 delays $\tau = 1,2,31,32,62,64 \times \tau_0$. A practical number of frequency cells is 4096. Two frequencies differing by 16 cells or more will each be measured with little or no cross effects.

6. [16 32 48] is a 3 signal IFM design using a single complete set of 4 uniformly-spaced delays $\tau = 16, 32, 48 \times \tau_0$. The frequency resolution is the same as the above designs, but the unambiguous bandwidth of this design is 1/16th that of the above designs. It is a Toeplitz design; if the delay lines are ideal (nondispersive/lossless), it may be implemented without calibration, using a polynomial root algorithm (see ifm2.m) for frequency. If the delay lines are not nearly ideal, the general algorithm (see ifm1.m and calib.m) must be used. This design provides the same frequency resolution as a 4 point DFT! A practical number of frequency cells is only 256; this design has only 1/16th the unambiguous bandwidth of designs 1 and 2 above.

The characterization of performance of an IFM design as used here has no precedent. The inclusion of multiple signal frequency measurements requires an expansion of the characterization of performance to specify how a design operates when two or three signals approach each other in frequency. The variety of designs above reveal that selecting a design on the basis of number of signals capacity, 1 frequency accuracy, closest 2 frequency spacing, still provides a choice of system parameters. If there is a 'best design' for a desired set of specifications, the present invention does not reveal it.

DRAWING FIGURES

FIG. 3A is a block diagram of a lossy integrator.

FIG. 3B is a block diagram of a lossless integrator.

FIG. 4 is a serial (tapped) delay line model implying the delay sum rule.

FIG. 5 is a complete set of parallel delay line correlators.

FIG. 6 is a block diagram of a frequency measuring system comprised of complete sets of delay line correlators.

REFERENCE NUMERALS IN DRAWINGS

Figure 1:
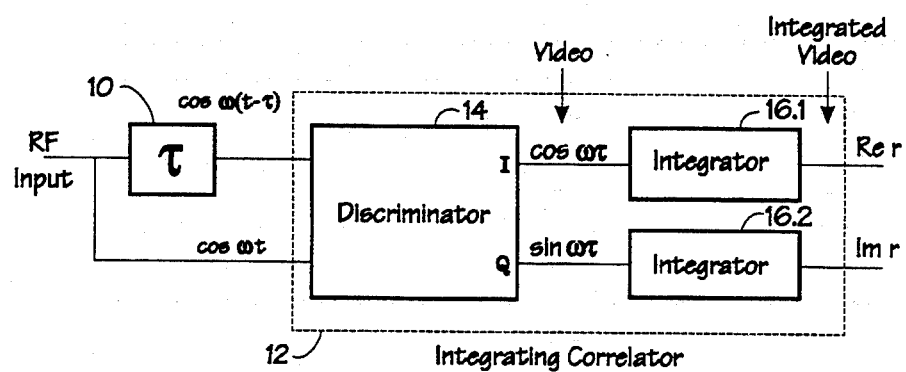
FIG. 1 is a block diagram of a delay line correlator with integrated I and Q outputs.

The reference numerals are double digit numbers such that the first digit is also the pertinent figure number. A decimal numbering system is used where repetition of a part suggests it.

| | |
|---|---|
| 10,22.1-22.n,42,44,52.1-52.3 | Delay Lines |
| 12,24.1-24.n,54.1-54.3 | Integrating Correlators |
| 14 | Frequency Discriminator |
| 16.1-16.2,32,34 | Integrator |
| 20,60 | RF Limiter-Amplifier |
| 26.1-26.n | I channel Analog-to-Digital Converters |

| | -continued |
|---|---|
| 27.1-27.n | Q channel Analog-to-Digital Converters |
| 28 | Computation Unit |
| 25 | Controller |
| 62.1-62.p | Complete Sets of Correlators |
| 64.1-62.p | IFM Computational Algorithm |
| 66 | Frequency Selection Logic |

DESCRIPTION OF THE PREFERRED EMBODIMENT

Referring to FIG. 1, a delay line correlator comprises a frequency discriminator 14, for producing in-phase I and quadrature Q video signals, given an RF input and a delayed input 10. The I and Q video signals are connected to integrators 16.1 and 16.2, according to FIG. 3A or FIG. 3B.

Figure 2:
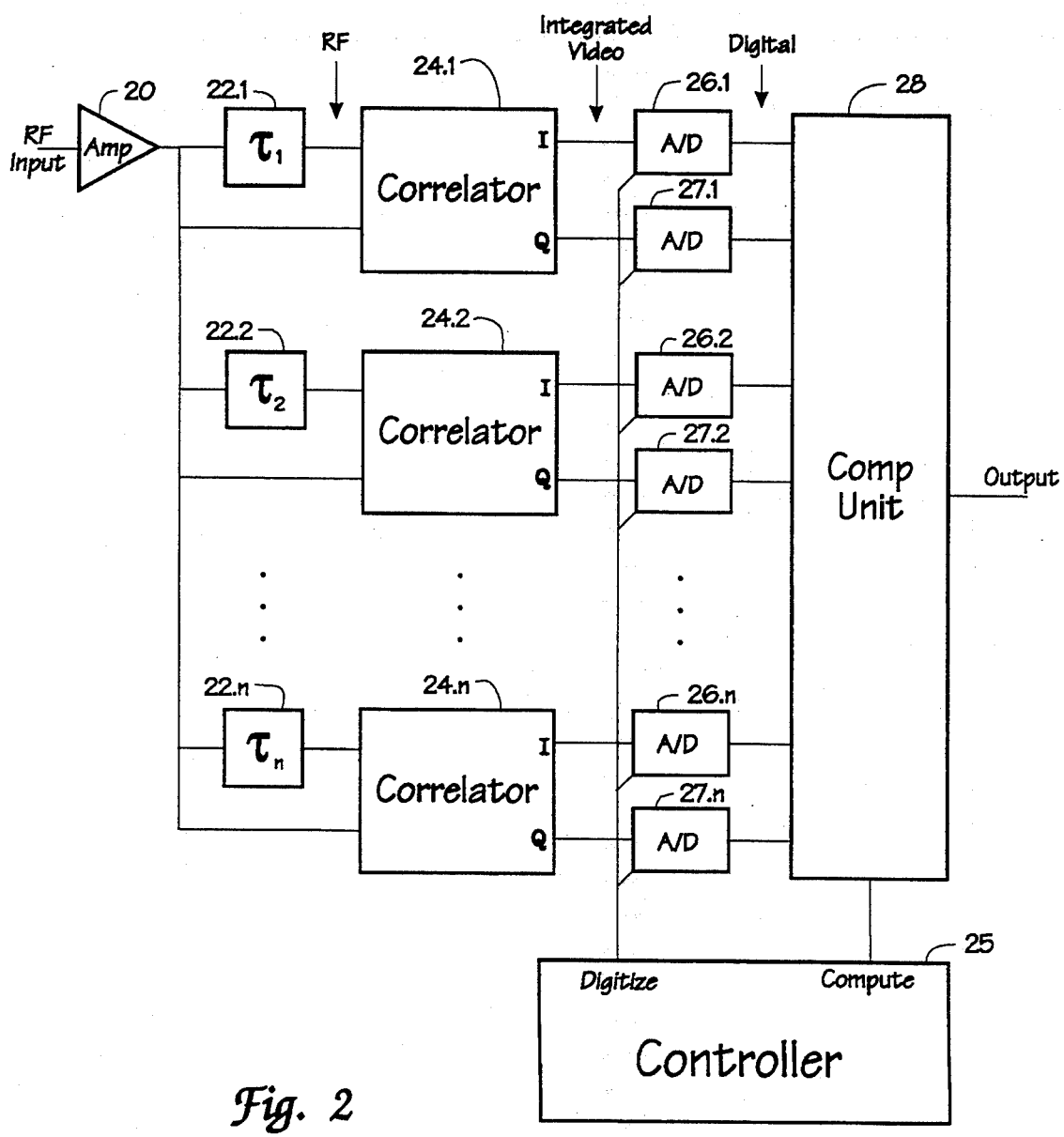
FIG. 2 is a block diagram of a preferred embodiment of the present invention; a complete set of delay line correlators, digitizers and computational means.

Referring to FIG. 2, a typical embodiment of the present invention includes n delay line correlators 24.1-24.n with delays 22.1-22.n comprising a complete set. Taken together, an I and Q output comprises the real and imaginary parts of a complex correlation $\tau$. The digitizers 26.1-26.n and 27.1-27.n simultaneously convert the analog correlations to digital representations.

The Computational Unit 28 operates under the Control Unit 25 in response to the digital representations of the complex correlations to carry out the algorithm for calculating the frequencies of the input signals. The computations are discussed in detail in the section OPERATION—COMPUTATION.

Referring to FIG. 4, the present invention utilizes complete sets of delays under the model of a serial (tapped) delay line; where the delays between all pairs of taps are embodied as distinct delay lines (see FIG. 5. FIG. 4 and FIG. 5 are shown for the case m =3 taps. The number of delays in the complete set is, at most, $m(m-1)/2$, here equal to 3; $\tau_{12}, \tau_{23}, \tau_{13}$. The time delay correlators 54.1,54.2,54.3 produce the complex correlations $r_{12}, r_{23}, r_{13}$ which comprise a complete set for the purpose of the present invention.

Referring to FIG. 6 or FIG. 2, the amplifier or limiter-amplifier 60 or 20, respectively, is included optionally to raise the RF signal input to a useful level for the correlators.

The preferred embodiment of FIG. 2 comprises a single complete set of delay line correlators. A preferred embodiment which comprises p such distinct complete sets is shown in FIG. 6. The p complete sets 62.1-62.p comprise a system of complete sets within the present invention. The computational algorithm 64.1-64.p comprises digitizing the output of the complete sets of correlators, and the computation 28 to calculate sets of measured frequencies $f_i^{(1)}$ to $f_i^{(p)}$. The frequency Selection Logic 66 processes the measured frequencies to remove ambiguities and select the final output frequencies. The detailed computations are given in the section OPERATION—COMPUTATION.

OBJECTS AND ADVANTAGES

Besides the objects and advantages of the Instantaneous Frequency Measurement (IFM) receiver, several objects and advantages of the present invention are as follows:

(a) The added capability to measure and report multiple frequencies of radar signals received simultaneously and under general conditions—without signal specific conditions imposed. Thus, pulses may overlap or not in the window of observation without significantly affecting performance. Signals may be long or short pulses or CW in any combination without significantly affecting performance.

(b) The assumption that delay lines are ideal is often not justified. Delay lines at microwave frequencies do exhibit attenuation losses of about 1-2 dB/100nsec at 1 GHz, increasing with frequency almost linearly. The present invention does not assume or require ideal (nondispersive/lossless) tapped delay lines. The calibration method of the present invention measures and records the characteristics of the actual hardware—the actual dispersion/loss in the delay lines and the system—implicitly in the stored calibration vectors. Thus, the present invention has a substantial advantage over methods which implicitly or expressly assume ideal (nondispersive/lossless) delay lines.

(c) The added improvement in RF sensitivity by integrating (either lossless or lossy) over a data window of selected duration T nanoseconds by implementing the delay line correlators as in FIG. 1. Implementing the present invention without such integration would require greater SNRs than necessary to operate successfully. With selectable duration T, the 'best' duration to match and thereby favor a specific radar pulse duration is available.

(d) The T nanosecond window of data analyzed may be initiated either asynchronously (upon independent detection of signal energy) or synchronously (repeating the data processing cycle uniformly). This offers a considerable advantage over the prior art; that is, only one sample vector need be taken to calculate the frequency measurements. Thus, the digitizing sample rate need not be higher than the video bandwidth and may be much lower or asynchronous.

(e) The present invention provides a basis for a variety of original IFM designs and design performance selection methods.

OPERATION—RF & VIDEO

The embodiment of FIG. 2 may be operated as follows. While RF input signals are being received, the amplifier-limiter 20 provides gain and amplitude limiting, the delay lines 22.1-22.n and correlators 24.1-24.n produce integrated video signals. The Controller 25 signals all digitizers 26.1-26.n and 27.1-27.n to simultaneously convert the 2n integrated analog video voltages to digital representations of n complex correlations. The Controller 25 correspondingly signals the Computational Unit 28 to receive and store the complex correlation data and then initiates the algorithmic response to the availability of the correlation data. The Computational Unit 28 carrys out the computational algorithm for computing the frequencies of the RF input signals for final output.

The Controller 28 may repeat the above sequence as often as possible consist with the time needed to compute results, or it may not repeat until receipt of an independent indication that signals are being received. The above sequence may be repeated synchronously or asynchronously.

In FIG. 6, the embodiment includes a system of p complete sets 62.1-62.p of delay line correlators and p corresponding computational units 64.1-64.p, each combination of which is of the form of FIG. 2. While RF input signals are being received, the amplifier-limiter 60 provides gain and amplitude limiting, the sets of measured frequencies $f_i(f)$ are input to the Frequency Selection Logic 66. The resulting measured frequencies are the final output.

The operational computations are described next.

OPERATION—COMPUTATION

In the following paragraphs, the procedure performed with the apparatus of this invention is described for practicing the method by which the simultaneous RF signals are analyzed. The steps for carrying out this procedure are listed in Table 1 and Table 2. The procedure is separated in two parts by operating the apparatus in two modes: the CALIBRATION MODE (Table 1) and the DATA MODE (Table 2). (The calibration is usually only activated once.)

TABLE 1

CALIBRATION MODE

1. Receive RF test signals at system input terminal.
2. Generate a calibration R matrix.
3. Generate calibration eigenvalues and calibration eigen vectors from the calibration R matrix.
4. Generate signal subspace
5. Store calibration eigenvectors with corresponding calibration frequencies.

The store of calibration eigenvalues and eigenvectors is referred to as the "Array Manifold".

TABLE 2

DATA MODE

1. Receive RF data signals to be analyzed.
2. Generate an R data matrix from the received RF signals.
3. Generate data eigenvalues and data eignvectors from the R data matrix.
4. Generate the data noise subspace.
5. Generate intersections of the array manifold with the signal subspace by minimizing the intersection of the manifold with the data noise subspace.

The sequence of computational operations required are expressed algorithmically as follows and may be implemented in MATLAB (The MathWorks, Natick, Mass. 01760) as included:

Given: Signals input to an IFM receiver utilizing a complete set of delay line correlators.

1. Collect measured $r_{ij}$'s, fill matrix R.
2. Compute minimum eigenvector $e_{min}(R)$.
3. Compute dot products $y_i$ with calibration vectors $e_{max}(f_i)$—obtained and stored when calib.m is run—where $$y_i = y(f_i) = e_{min}^*(R) \cdot e_{max}(f_i)$$

4. Find the (m−1) least $|y_i|$; output up to (m−1) corresponding frequencies with user selectable threshholding on closeness to zero.
5. Return to 1 for next data.

The MATLAB function ifm1.m can be used to carry out the above sequence of steps:

function [freq,y] = ifm1(r,cal,fcal)

```
% [freq,y] = ifm1(r,cal,fcal)    Inst Freq Meas (IFM) with calibration:
%                                "r" vector of correl's [r1 r2 ... rn],
%                                "cal" (m x nn) matrix of calib min eig vectors,
%                                "fcal" vector of cal freq's.
%    % ROSchmidt, 94jan1
[m,nn] = size(cal);
R = r2mat(r);                    % Make vec r into matix R.
[evecs,evals] = eig(R);          % Eigen vals/vecs.
[evals,ix1] = sort(real(diag(evals)));
emin = evecs(:,ix1(1));          % Min Eigen vec.
y = abs( emin'*cal );            % Dot Prod w/ cal vecs.
ix2 = ([inf,y(1:nn−1)] > y) & (y <= [y(2:nn),inf]); % get local minima.
mini = y(ix2);                   % Extract local minima.
fmin = fcal(ix2);                % Extract freq of local minima.
[yy,ix3] = sort (mini);          % Sort local minima.
m1 = min(m−1,sum(yy <= .05));    % Up to m−1 minima within .05 of unit circle.
freq = zeros(1,m−1);
freq(1:m1) = fmin(ix3(1:m1));    % Up to m−1 good freq's.
```

Given: Calibration frequencies $f_1, f_2, \ldots f_{nn}$

1. With Signal Generator providing RF signal input, set generator frequency to $f_i$.
2. Collect measured $r_{ij}$'s, fill matrix R.
3. Compute maximum eigenvector $e_{max}(R)$.
4. Store maximum eigenvector as calibration vector $e_{max}(fi)$.
5. Return to 1 for next $f_i$ to calibrate.

The MATLAB function calib.m can be used to carry out the above sequence of steps:

```
function cal = calib(fcal,tau,T)
% cal = calib(fcal,tau,T) generates "cal" matrix of 'max eigvecs,'
%                    given: freq vec "fcal" (GHz), set of "tau"s.
%    % ROSchmidt, 94jan1
nf = length(fcal);
n = length(tau);
j = sqrt(−1);
j2pi = j*2*pi;
for k=1:nf
    x = exp(j2pi*fcal(k)*(0:T));         % Sig at tap 0
    for i=1:n
        X(i,:)=exp(j2pi*fcal(k)*((0:T)−tau(i)));  % Sigs at taps 1 to n
    end
    cor = x * X';                         % Correls at tau__1 to tau__n
    cor = cor/(T+1);
    r(k,:) = cor;
end
for i=1:nf
    R = r2mat(r(i,:));                    % Make R
    [evecs,evals] = eig(R);               % Eig vecs/vals
    [evals,idx] = sort(real(diag(evals)));
    cal(:,i) = evecs(:,idx(4));           % Max eigvec == calvec
end
```

Given: Signals input to an IFM utilizing a complete Toeplitz set of delays

1. Collect measured $r_{ij}$'s, fill matrix R.
2. Compute minimum eigenvector $e_{min}(R)$.
3. Compute roots $z_i$ of (m−1)th order polynomial having elements of $e_{min}^*$ as coefficients.
4. Compute $f_i$ from $arg(z_i) = 2\pi f_i \tau_0$ for i=1,2, ..., m−1.
5. Return to 1 for next data.

The MATLAB function ifm2.m can be used to carry out the above sequence of steps:

```
function [f,z] = ifm2(r,tau,k)
% [f,z] = ifm2(r,tau,k) special Inst Meas (IFM), no calibration:
%                       calculates k freqs for a Toeplitz set of tau's.
%                       Output: 0 < f < 1/tau(1).
%                       Input: [tau 2tau 3tau ... ktau].
   % ROSchmidt, 94jan10
   F = 1 ./ tau;        %Unambig freq ranges of channels
   n = length(tau);
   for i=1:n−(k−1)
      rr = [0,r(i:i+k−1)];
      R = toeplitz(rr',rr);
      [evec,eval]= eig(R);
      [eval,idx] = sort(diag(real(eval)));
      emin = evec(:,idx(1));
      zz = log(roots(emin'));        % Individual Signal z = ln r
      [q,ix] = sort(abs(real(zz)));  % Sort on nearness to unit circ
      z(i,:) = zz(ix).';
      f(i,:) = imag(z(i,:))./(2*pi*tau(i));
   end
   f = f + (F(1:n−(k−1))'*ones(1,k)).*(f<0); % Xfm to 0 < f < F
   for i=2:n−(k−1)
      ff = [];
      for ii=1:k
         ff = [ ff , f(i,ii)+F(i)*(0:2 (i−1)−1) ];
      end
      for ii=1:k
         [q,ix] = min( abs(ff−f(i−1,ii)) ); % Min dist to (i−1,ii)th
         f(i,ii) = ff(ix);
      end
   end
   f = f(n−(k−1),:) % Discard interim results.
```

The MATLAB software has been used to simulate the performance of the present invention. The above software carries out only the mathematical operations described and provides the same essential operations which would be included in an implementation of the present invention.

Although eigenvalues and eigenvectors are described for use in the algorithms, it may be noted that singular values and singular vectors can be used in a manner which is entirely equivalent.

The computational requirements are large due principly to, first, the computation of eigenvalues and eigenvectors and, second, the use of the stored calibration data in a string of vector clot products between a measured minimum eigenvector and, perhaps, $2,0007\tau_m/\tau_1$ stored calibration vectors. The number of operations (a multiply or an add) needed to carry out the first is about $50m^3$ and, for the second, about 25,000m, given 4,096 calibration frequency cells (12 bits).

| # Sigs | EigenSystem | Dot Products |
|---|---|---|
| 2 | 1,350 ops | 75,000 ops |
| 3 | 3,200 | 100,000 |
| 4 | 6,250 | 125,000 |

It is reasonable to expect multiple special purpose computational processors to share this compute load.

CONCLUSION, RAMIFICATIONS, & SCOPE OF INVENTION

This invention relates in general to microwave signal frequency measurement devices and more particularly to IFM receivers which utilize multiple delay line frequency discriminators and angle (frequency) digitizers. The conventional IFM receiver is a radio frequency (RF) receiver used primarily in electronic warfare (EW). The basic function of the prior art is to measure the frequency of pulsed or continuous radar signals that are received sequentially in time without overlap; that is, non-simultaneous signals. The present invention replaces the angle (frequency) digitizers with digitization of an integrated video voltage and a new and specific computational procedure which reports the frequencies of one or several simultaneously received pulse or CW signals. The present invention measures the frequencies of simultaneous signals based on as little as one sample of all the correlation outputs of a complete set of delay line correlators.

The present invention provides an IFM receiver with the capability to measure the frequencies of simultaneously received signals. Without this invention, IFM receivers generally report erroneous frequencies hen multiple signals are received simultaneously. With this invention, the erroneous measurements are eliminated, and the IFM receiver provides frequency measurements for all of the multiple signals received simultaneously.

Although the above description is often specific, the purpose is to provide illustrations of presently preferred embodiments of this invention. It is understood that certain modifications to the invention as described may be made, as might occur to one with skill in the field of this invention, within the scope of the appended claims. Therefore, all embodiments comtemplated hereunder which achieve the objects of the present invention have not been shown in complete detail. Other embodiments may be developed without departing from the spirit of the invention or from the scope of the appended claims.

I claim:

1. A system for detecting a plurality of RF signals and measuring a frequency of each one of said plurality of RF signals applied simultaneously to a first terminal of said system, said system comprising:

a plurality of delay line correlator means for generating a plurality of video signals from said plurality of RF signals, one video signal for one correlator means, respectively;

each one of said plurality of delay line correlator means having a delay line, a phase discriminator and a first integrator and a second integrator;

each said delay line having an input terminal adapted for connection to said first terminal of said system and said delay line having an output terminal connected to an input terminal of said phase discriminator, said phase discriminator having another input terminal connected to said input terminal of said system and said phase discriminator having one output terminal connected to a first terminal of said first integrator and another output terminal connected to an input terminal of said second integrator such that an in-phase component signal and a quadrature-phase component signal of said respective video signal is generated at an output terminal of said first integrator and said second integrator respectively;

a plurality of A/D convertor means for converting each one of said plurality of in-phase and quadrature-phase component signals to a digitized in-phase component signal and a digitized quadrature-phase componet signal respectively, one convertor for each said first integrator and one convertor for each said second integrator;

said digitized in-phase and quadrature-phase component signals expressed with b digital bits;

each said A/D converter having an input terminal connected to an output terminal of said respective integrator, each said convertor having a plurality of bits b, for representing said component voltage signal;

means operably connected to said A/D convertors and in operable combination with delay times selected for said delay lines for computing and displaying from said plurality of digitized in-phase and quadrature phase component signals a plurality of frequency values, one frequency value for each one of said plurality of RF signals applied to said input terminal of said system.

2. The system of claim 1 wherein said system has a predetermined bandwidth B, a maximum quantity, (m−1), of RF signals received simultaneously by said receiver and said receiver comprises:

each one of said delay times selected from a plurality of delay times respectively;

a smallest one of said plurality of delay times being 1/B;

a largest one of said delay times being selected from a range of delay times consisting of delay times between 1/B to 128/B;

all said plurality of delay times between 1/B and said largest one of said delay times constituting a complete set of delay times:

said complete set of delay times being all of the combinations of delay times between all pairs of taps of a hypothetical tapped delay line having m delay segments with a tap between delay segments and including a smallest delay segment having a delay time equal to 1/B and a total delay time between ends of said hypothetical delay line equal to said largest one of said delay times;

each said delay segment having a delay selected such that the sum of all delays times of said segments equals said total delay time.

3. The system of claim 1 wherein said integrators are selected from the set of integrators consisting of finite sum integrators and T second integrators.

4. The system of claim 1 wherein said integrators are lossy integrators.

5. The system of claim 4 wherein each said integrator is a low pass RC filter.

6. The system of claim 1 wherein said system comprises an antenna having an output terminal connected to said first terminal and is adapted for receiving said plurality of RF signals transmitted from a plurality of transmitters.

7. The system of claim 2 wherein said means for computing comprises:

a first memory means for storing a group of calibration vectors wherein each calibration vector is a set of digitized in-phase and quadrature-phase component signals generated by one of a group of test RF signals, each said test RF signal causing output from a respective correlator by applying one of a plurality of test RF signals to said input terminal of said system;

each test RF signal of a corresponding calibration vector having an RF calibration frequency that is greater by a uniform value from a next smaller one of said RF calibration frequencies begining with a smallest RF calibration frequency selected from the RF frequencies in said RF bandwidth;

said group of RF calibration frequencies having a number of RF calibration frequencies equal to a quantity $2^b$;

a second memory means for storing a data group of said digitized in-phase and quadrature-phase component signals arranged in a matrix format;

means for computing a plurality of eigenvalues and eigenvectors of said data group stored in said matrix format in said second memory means;

means for selecting from said plurality of eigenvalues and corresponding eigenvectors a maximum eigenvalue and a maximum eigenvector;

means for activating said system to operate in a calibrate mode such that said system computes and selects a maximum eigenvector from each test matrix of a plurality of test matrices, each test matrix generated by application of one of said group of test RF signals to said input terminal of said system;

said maximum eigenvalue being a signal subspace corresponding to said stored test matrix;

each said maximum eigenvector being stored as a calibration vector with said corresponding RF calibration frequency in said first memory means;

means for activating said system to operate in a data mode such that said system selects and computes a minimum eigenvector of a data matrix stored in said second memory means by application of said plurality of RF signals to said system;

said minimum eigenvector being a noise subspace corresponding to said stored data matrix:

means for computing frequency vectors of said RF signals, said frequency vectors being selected from those calibration vectors of said plurality of calibration vectors which are orthogonal to said received noise subspace;

means in operable combination with said first and second memory means, means for computing frequency, said means for activating said system to operate in a calibrate and a data mode, said means for computing a plurality of eigenvalues, said means for selecting minimum and maximum eigenvalues, for outputting said frequency corresponding to said frequency vector;

said frequencies of said frequency vectors being the frequencies of said RF signals.

* * * * *